US005495666A

United States Patent [19]

Korsunsky et al.

[11] Patent Number: 5,495,666

[45] Date of Patent: Mar. 5, 1996

[54] METHOD FOR ASSEMBLING A CONNECTOR TO THE EDGE OF A CIRCUIT BOARD

[75] Inventors: Iosif Korsunsky; Joanne E. Shipe, both of Harrisburg; Tod M. Harlan, Mechanicsburg; Gerald L. Foreman, Hummelstown; Robert C. Klotz; Robert W. Brown, both of Harrisburg, all of Pa.

[73] Assignee: The Whitaker Corporation, Wilmington, Del.

[21] Appl. No.: 453,049

[22] Filed: May 26, 1995

Related U.S. Application Data

[62] Division of Ser. No. 116,170, Sep. 2, 1993, Pat. No. 5,444, 906.

[51] Int. Cl.[6] .............................. H05K 3/32; H01R 9/09

[52] U.S. Cl. .............................. 29/834; 29/593; 29/842

[58] Field of Search .............................. 29/593, 705, 741, 29/758, 759, 834, 842, 837, 845; 439/79–84

[56] References Cited

U.S. PATENT DOCUMENTS

| | | | |
|---|---|---|---|
| 3,667,102 | 6/1972 | Guillemette et al. | 29/747 |
| 4,465,176 | 8/1984 | Long, Jr. | 198/400 |
| 4,553,322 | 11/1985 | Cappos et al. | 29/739 |
| 4,561,178 | 12/1985 | van de Kerkhof | 29/749 |
| 4,623,293 | 11/1986 | Brown et al. | 414/126 |
| 4,739,550 | 4/1988 | Schaeffer et al. | 29/741 |
| 4,747,209 | 5/1988 | Schaeffer et al. | 29/758 X |
| 4,894,015 | 1/1990 | Stockers et al. | 29/842 X |
| 5,127,839 | 7/1992 | Korsunsky et al. | 439/79 |
| 5,186,638 | 2/1993 | Pusch | 29/842 X |
| 5,199,885 | 4/1993 | Korsunsky et al. | 439/79 |
| 5,355,583 | 10/1994 | Osumi et al. | 29/759 X |

FOREIGN PATENT DOCUMENTS

| | | | |
|---|---|---|---|
| 3-245600 | 11/1991 | Japan | 29/593 |
| 5-110296 | 4/1993 | Japan | 29/834 |

*Primary Examiner*—Peter Vo
*Attorney, Agent, or Firm*—Anton P. Ness

[57] ABSTRACT

A method for assembling an electrical connector (10) to the edge (18) of a printed circuit board (12). A machine (50) incorporates an actuating mechanism that requires only a single input motion to achieve a variety of functional motions within the machine. The machine includes a carriage assembly (54) that moves substantially vertically within the frame of the machine to sense the thickness of the circuit board and then to align the centerline of the connector held on fixture (280) with the exact center plane (44) of the board. A slide member (140) then moves toward the connector, causing a pair of comb members (252,254) to close into position in front of the moving connector. The solder tails (38,40) of the connector (10) then enter spaced slots (260) in the edges of the comb members for support and the connector housing engages the face (272) of the combs, pushing them toward the circuit board. Angled free ends of the solder tails (38,40) of the connector then engage the corners of upper and lower board surfaces (14,16) at the board edge (18), and the center row of ground bus posts (32) are forced into apertures (26) in the edge of the board by a pusher member (174) until they contact plated through holes (24) in the board while the outer rows of tails cam out to and bear against and along the two opposite major board surfaces and into contact with solder pads thereon.

4 Claims, 9 Drawing Sheets

METHOD FOR ASSEMBLING A CONNECTOR TO THE EDGE OF A CIRCUIT BOARD

RELATED APPLICATION INFORMATION

This is a Divisional application of U.S. patent application Ser. No. 08/116,170 filed Sep. 2, 1993, now U.S. Pat. No. 5,444,906.

FIELD OF THE INVENTION

The present invention is related to a machine for positioning and assembling an electrical connector to the edge of a printed circuit board and in particular to a machine that, during such assembly, compensates for the thickness of the board that varies from board to board.

BACKGROUND OF THE INVENTION

In certain high density circuit board applications such as board to board interconnections one of the mating connectors is attached to the edge of one of the boards and the other connector is either attached to the edge or on the surface of the other board. Such connectors, when mounted to the edge of the board, occupy less board space than their surface mount counterparts, and therefore are more desirable in these applications. Examples of these types of connectors are disclosed in U.S. Pat. Nos. 5,199,885 and 5,127,839 which issued to Korsunsky et al. on Apr. 6, 1993 and Jul. 7, 1992 respectively. As the circuitry on these circuit boards becomes more dense the edge mounted connector must become correspondingly smaller resulting in very delicate contacts. Any variation in alignment during assembly of the connector to the circuit board may cause the contacts to become damaged. Therefore, precise alignment is necessary. However, variations in the thickness of the circuit board due to allowable manufacturing dimensional tolerances make it difficult to consistently and accurately align a high density edge mounted connector with the edge of the board. This is especially the case where the connector includes contacts that must be connected to circuitry on both sides of the board. What is needed is an assembly machine having the ability to sense the actual thickness of the circuit board and align the connector so that the centerline between the opposing contacts is substantially coincident with the actual center plane of the circuit board during assembly. This will effectively split the difference in board thickness variation between the two rows of opposing contacts, thereby reducing the chance of damaging the contacts. The present invention is directed to this capability.

SUMMARY OF THE INVENTION

A machine is disclosed for positioning an electrical connector with respect to the edge of a circuit board for electrical and mechanical attachment of leads of the connector to circuitry on a major surface of the circuit board. The circuit board defines a plane that intersects the center of the edge and is substantially parallel with the major surface. The machine includes a frame, means attached to the frame for receiving the circuit board and positioning the major surface and the edge with respect to the frame, sensing means for sensing the thickness of the circuit board, and alignment means coupled to the frame and responsive to the sensing means for positioning the connector in a first position in alignment with the plane. Advancing means is provided for moving the connector from the first position along the plane and in alignment therewith to a second position wherein the leads of the connector arc in engagement with the circuitry on the circuit board. The means for receiving the circuit board may be a fixture precisely positionable on a ledge forwardly of the connector-applying region of the machine and include an upper surface shaped to complement the bottom surface of a particular card, and thus be customized.

DESCRIPTION OF THE PREFERRED EMBODIMENT

Figure 1:
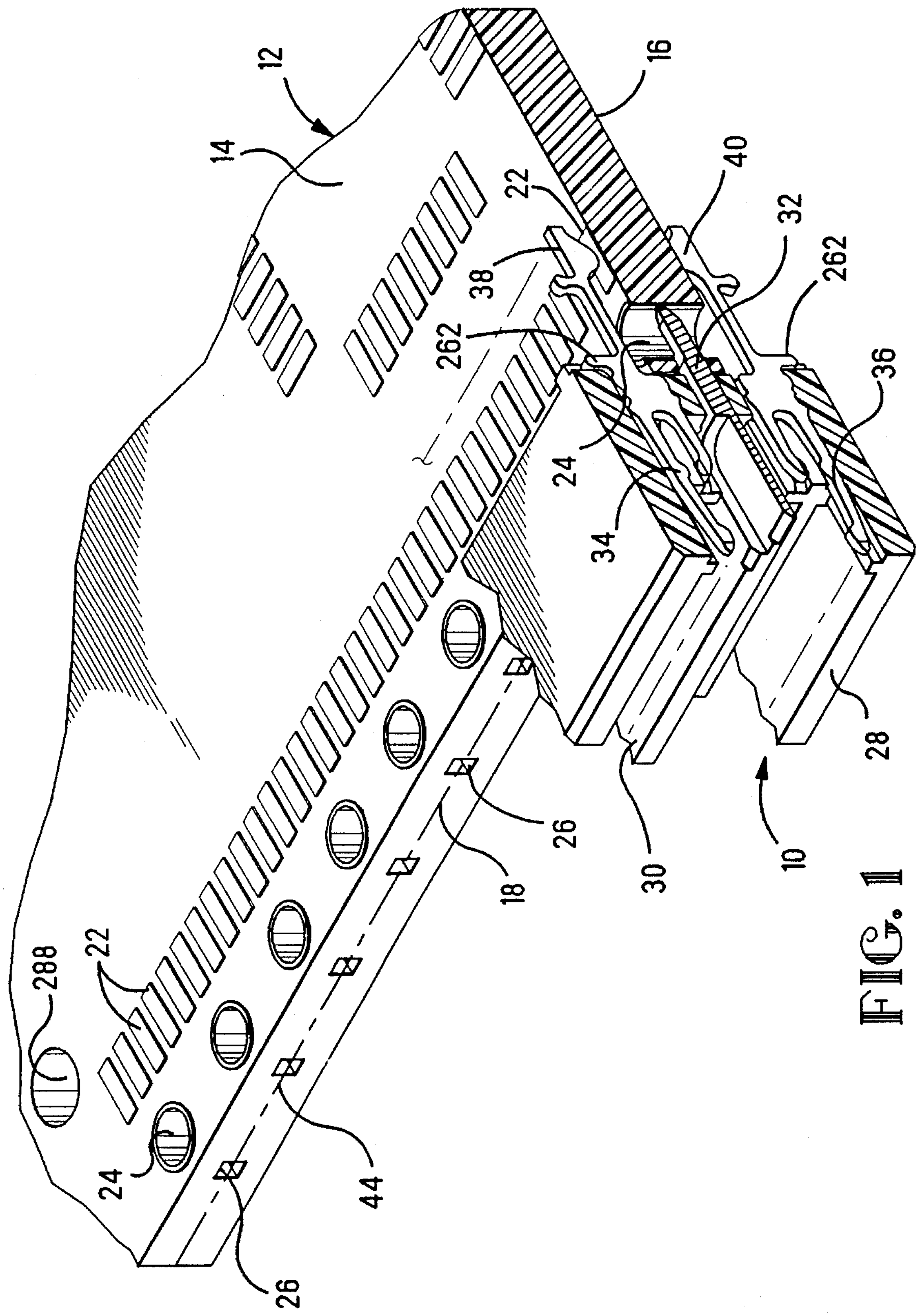
FIG. 1 is an isometric view of an electrical connector and circuit board of the type to be assembled together by the machine of the present invention.

There is shown in FIG. 1 an edge mount electrical connector 10 and a circuit board 12 to which the connector is to be attached. The circuit board 12 has two substantially parallel major surfaces 14 and 16 and an edge 18 defining a perpendicular edge surface. Metalized circuitry (not shown) is arranged on each of the major surfaces and terminates in either one of the several contact pads 22 or one of the several plated through holes 24. The plated through holes 24 are usually connected to ground. An opening 26 is formed in the edge 18 in alignment with and intersecting each hole 24. The connector 10 includes a housing 28 having a ground bus 30 extending along its longitudinal center with ground posts 32 projecting through and outwardly of the housing, and a row of upper contacts 34 and a row of lower contacts 36 on either side of the ground bus 30 having leads or solder tails 38,40 respectively. Opposing solder tails 38,40 are spaced slightly closer together than the thickness of the board but with angled free ends so that when the connector is moved toward the board along the dashed lines 42, the free ends of the contacts engage the edges of the board and cam outwardly then slide along the surfaces of the board until they electrically engage their respective contact pads 22. Additionally, as the connector is being moved toward the edge of the board, the ground posts 32 enter their respective openings 26 and engage and enter the plated through holes 24. After assembly the unit is then subjected to a soldering operation where each of the posts 32 and solder tails 38,40 are soldered to their respective plated through holes 24 or solder pads 22.

The contacts 34 and 36, in the present example, are on 0.025 inch spacing resulting in very small delicate structures. It is therefore necessary to very precisely align the connector 10 and its two rows of solder tails 38 and 40 with the actual center of the edge 18. That is, a plane 44, shown in phantom lines in FIG. 1, that is parallel with and centered between the two major surfaces 14 and 16 and extending outwardly through the center of the edge 18, must pass between the two rows of tails so that the opposing pairs of tails 38 and 40 are equidistant from the plane. The machine of the present invention, that will now be described, will sense the thickness of the circuit board 12, determine the location of the plane 44, accurately position the connector 10 with respect to the plane, and assemble the connector to the circuit board.

Figure 2:
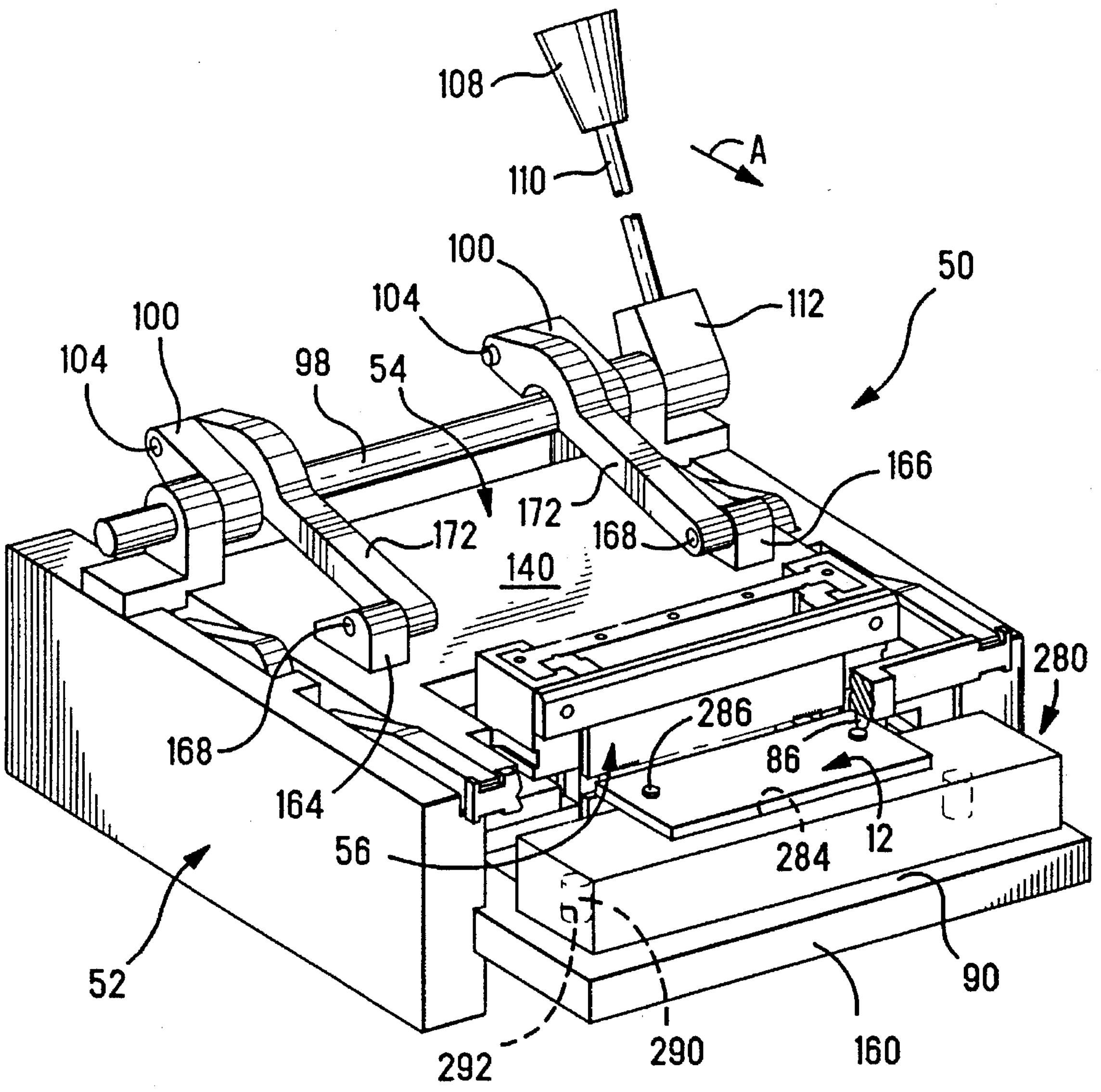
FIG. 2 is an isometric view of a machine incorporating the teachings of the present invention.
Figure 3:
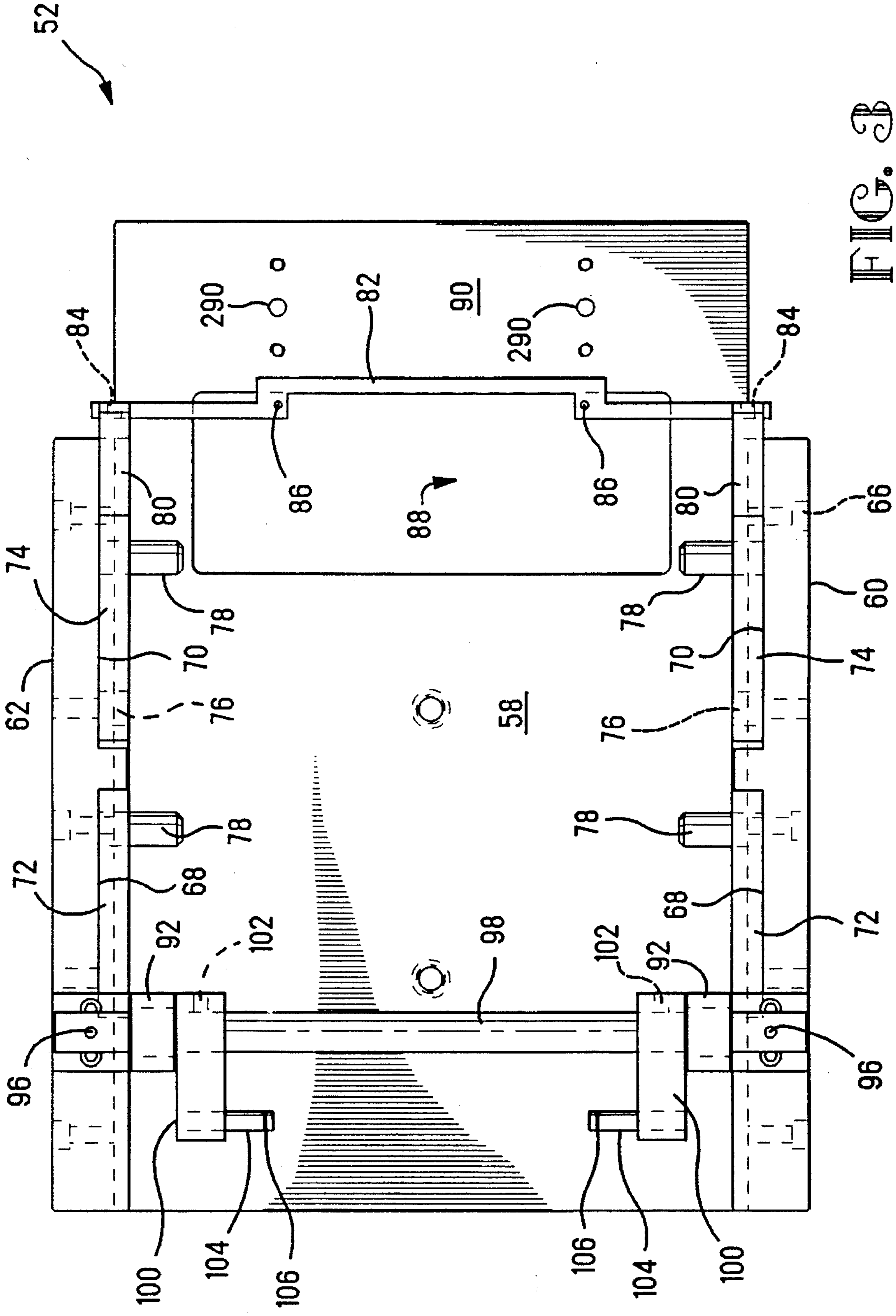
FIG. 3 is a plan view of the frame and link assembly of the machine shown in FIG. 2.
Figure 4:
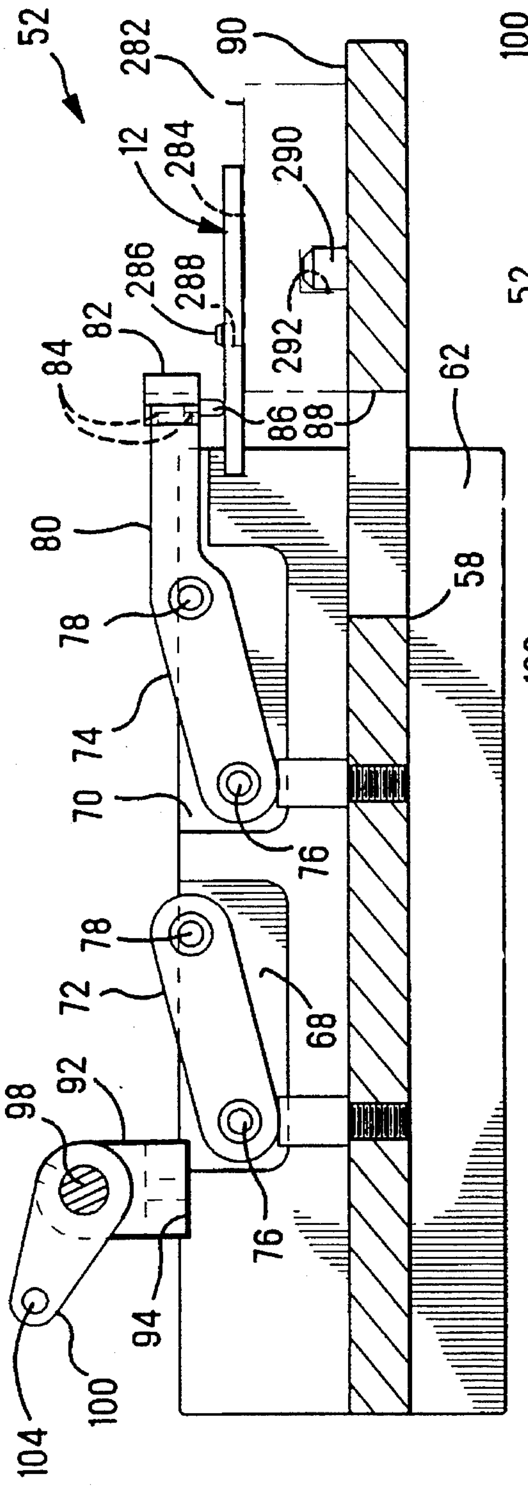
FIG. 4 is a cross-sectional view taken along the lines 4—4 in FIG. 3 and also showing a fixture and a circuit board in position for application of a connector.
Figure 5:
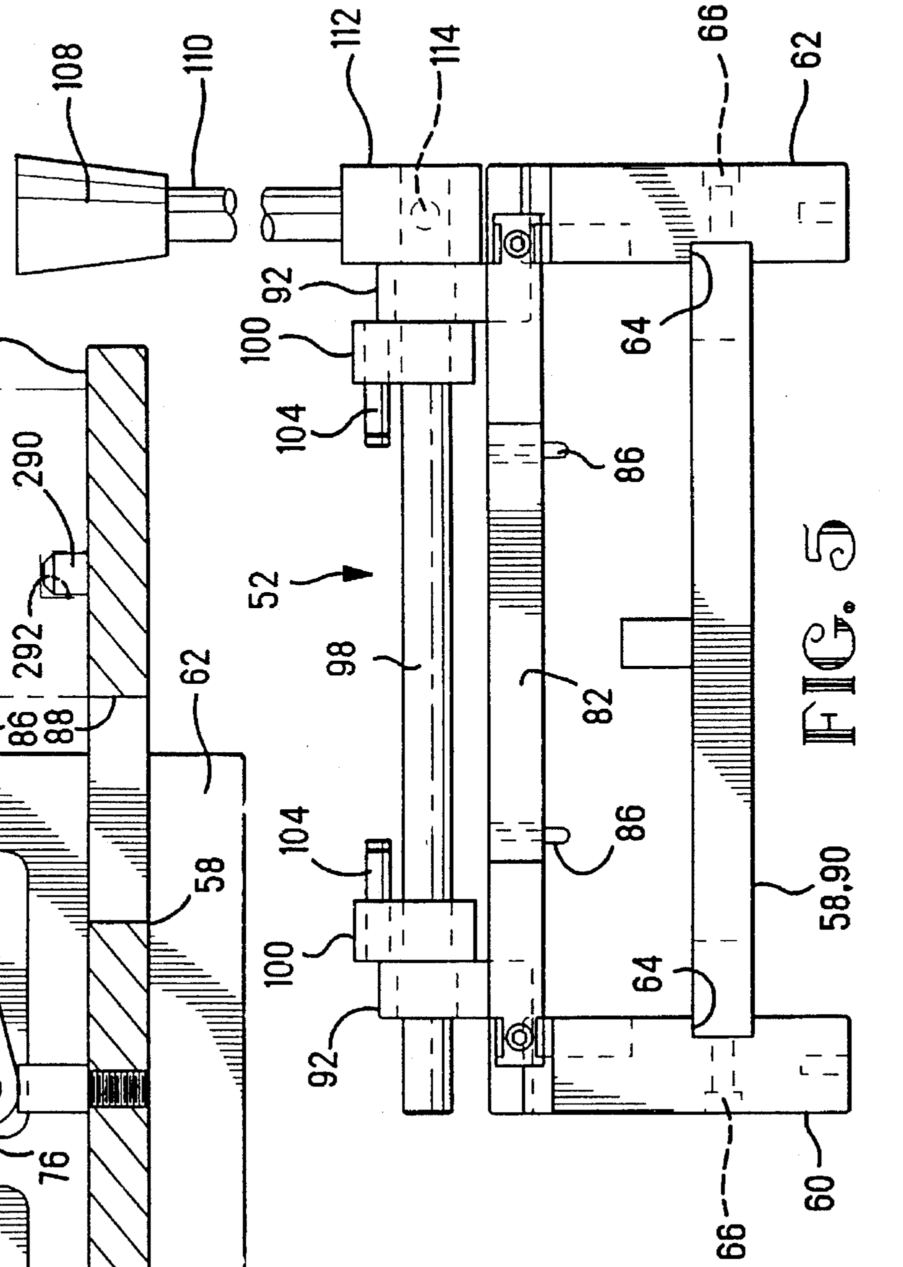
FIG. 5 is an end view of the assembly shown in FIG. 3.

There is shown in FIG. 2 a machine 50 having a frame and link assembly 52, a carriage assembly 54, and a connector holder assembly or module 56. The frame and link assembly 52, as best seen in FIGS. 3, 4, and 5 includes a base plate 58 supported by left and right side rails 60 and 62 respectively. The base plate 58 seats in a pair of slots 64 formed in the side rails and is secured in place by the screws 66. Each of side rails 60 and 62 has two cutouts formed therein, a rear cutout 68 and a forward cutout 70 for receiving coupling links 72 and 74 respectively. Each coupling link is pivotally attached to its respective side rail within the cutouts by means of a shoulder screw 76 and has a pin 78 spaced from and axially parallel with the shoulder screw and projecting toward the interior of the assembly for attachment to the carriage assembly, as will be explained below.

A sensing means of the machine is coupled to connector holder assembly 56. The pins 78 are pivotally journaled in their respective coupling links 72 and 74. Each of the links 74 includes an extension 80 that projects beyond the end of its respective rail 60, 62 as shown in FIGS. 3 and 4. A sensor bar 82 is attached to the ends of the two extensions 80 by means of the screws 84 as shown. A pair of spaced sensor pins 86 are pressed into holes in the sensor bar 82 and extend downwardly toward the base plate 58 for a purpose that will be explained. Base plate 58 has a cutout 88 for clearance for the connector holder assembly 56 and extends beyond the ends of the side rails 60 and 62 to provide a mounting surface or ledge 90 for supporting and holding tooling 280 that positions and holds the circuit board 12 during assembly of the connector 10 to the board (in phantom in FIG. 4).

A pair of L-shaped pillow blocks 92 are seated in shallow slots 94 formed in the upper surfaces of the side rails 60 and 62 and secured in place by means of the screw 96. A shaft 98 is journaled for rotation in the pillow blocks 92. A pair of crank arms 100 are secured to the shaft 98 by means of the set screws 102 tightened against flats on the shaft. The crank arms are spaced adjacent each pillow block so that all appreciable end play of the shaft is removed. Each crank arm 100 has a crank pin 104 pressed into a hole in the end of the arm so that the two pins extend toward each other as shown in FIG. 3. Each crank pin has a groove 106 for receiving a retaining ring for a purpose that will be explained. The shaft 98 extends beyond the pillow blocks 92 on both sides of the carriage assembly for mounting a handle 108 on either side, as desired. The handle includes a shank 110 that is threaded into a hole in a collar 112 and secured to the shaft by means of a set screw 114. The handle 108 is used to manually operate the machine as will be described below.

The carriage assembly 54, as best seen in FIGS. 6, 7, 8, and 9 includes a carriage plate 120 having a top surface 122 and a bottom surface 124. A first recess 126 is formed in the surface 122 and a second recess 128 is formed in the floor of the first recess, both recesses being parallel with the sides of the carriage plate 120. Four elongated holes 130 are formed through the floor of the first recess, extending completely through the carriage plate. Four slots 132 are formed in the top surface 122, each slot including a wedge member 134 that is secured in one end of the slot by means of a screw 136. The angled surface of the wedge faces the other end of the slot thereby defining a cavity 138 for receiving one of the pins 78 that project from the links 72 and 74. To assemble the carriage plate 120 to the frame and link assembly 52, the wedges 134 are removed, the carriage plate positioned between the side rails 60 and 62, and the carriage plate lowered until the pins 78 enter the slots 132. The wedges are replaced and the screws 136 are then tightened causing the angled surfaces of the wedges to engage the pins 78, locking them in place within the cavities 138.

The side rails 60 and 62 of the frame, the links 72 and 74, and the carriage plate 120 form a four bar linkage where the carriage plate 120 may pivot about the shoulder screws 76 while remaining parallel with the surface 90 of the base plate 58. As the carriage plate so pivots, the sensing bar 82 moves toward or away from the surface 90 along a path that is substantially normal to the surface, although the path is arcuate. This is because the angle that the two pivot points of each of the links makes with the surface 90 is only about 10 degrees or less. A slide member 140 is arranged to slide back and forth within the recess 126 of the carriage plate 120 along a centerline 142 that is parallel with the surface 90. The slide member 140 includes a follower rail 144 extending forward along each side thereof in a direction parallel with the centerline 142. A cam follower pin 146 is positioned near the free end of each of the rails 144, having a reduced diameter shank that is journaled for rotation in a hole in the rail for a purpose that will be explained.

The carriage plate 120 includes a pair of spaced slots 148 formed in the bottom surface 124 that are parallel with the centerline 142. Each of the slots 148 loosely receives a rail 150 which has a lower follower rail 152 extending forward along the outside edge thereof, directly under and in alignment with the follower rails 144. The free ends of the lower follower rails 152 each have a cam follower pin 146 which is journaled for rotation in a hole therein in alignment with the cam follower pins in the follower rails 144. The rails 150 are attached to opposite sides of the slide member 140 by four screws 154 and four spacers 156 that extend through the elongated holes 130. The spacers 156 are slightly longer than the thickness of the carriage plate 120, at that point, so that the slide member and the rails 150 are free to slide back and forth within the recess 126 and within the limits of the elongated holes 130. The carriage plate 120 includes a left forward projecting portion 158 and a right forward projecting portion 160 that form an opening 162 for receiving the connector holding assembly 56 so that the cam follower pins 146 can operationally engage cams thereon, as will be explained below. A left clevis 164 and a right clevis 166, each having a pin 168 extending therefrom, are seated in shallow recesses on opposite sides of the slide member 140 and secured in place by means of the screws 170. The clevises 164 and 166 are positioned so that the two pins 168 are parallel and in substantial alignment with a respective crank pin 104. A pair of levers 172, each having a hole at one end sized for a slip fit with the pin 168 and a hole at the other end sized for a slip fit with the crank pin 104, interconnect the slide member 140 with the shaft 98 as shown in FIG. 2.

As the handle 108 is moved in the direction indicated by the arrow A in FIG. 2, the crank arms 100 rotate upwardly causing the carriage assembly 54 to move downwardly toward the surface 90 as the links 72 and 74 pivot about their respective shoulder screws 76 until the sensor pins 86 engage the upper or first surface of the circuit board 12 which is on a fixture mounted to the surface 90, shown in phantom lines in FIG. 4. At this point the vertical position of the carriage assembly 54 is known with respect to the upper surface of the board, and the position of the lower surface of the board is also known since it is resting on a fixture of known height from the surface 90. Therefore, the exact position of the center plane 44 of the circuit board 12 is known with respect to the machine 50. As movement of the handle continues, the levers 172 cause the slide member 140 to slide within the recess 126 for a purpose that will be explained.

Figure 6:
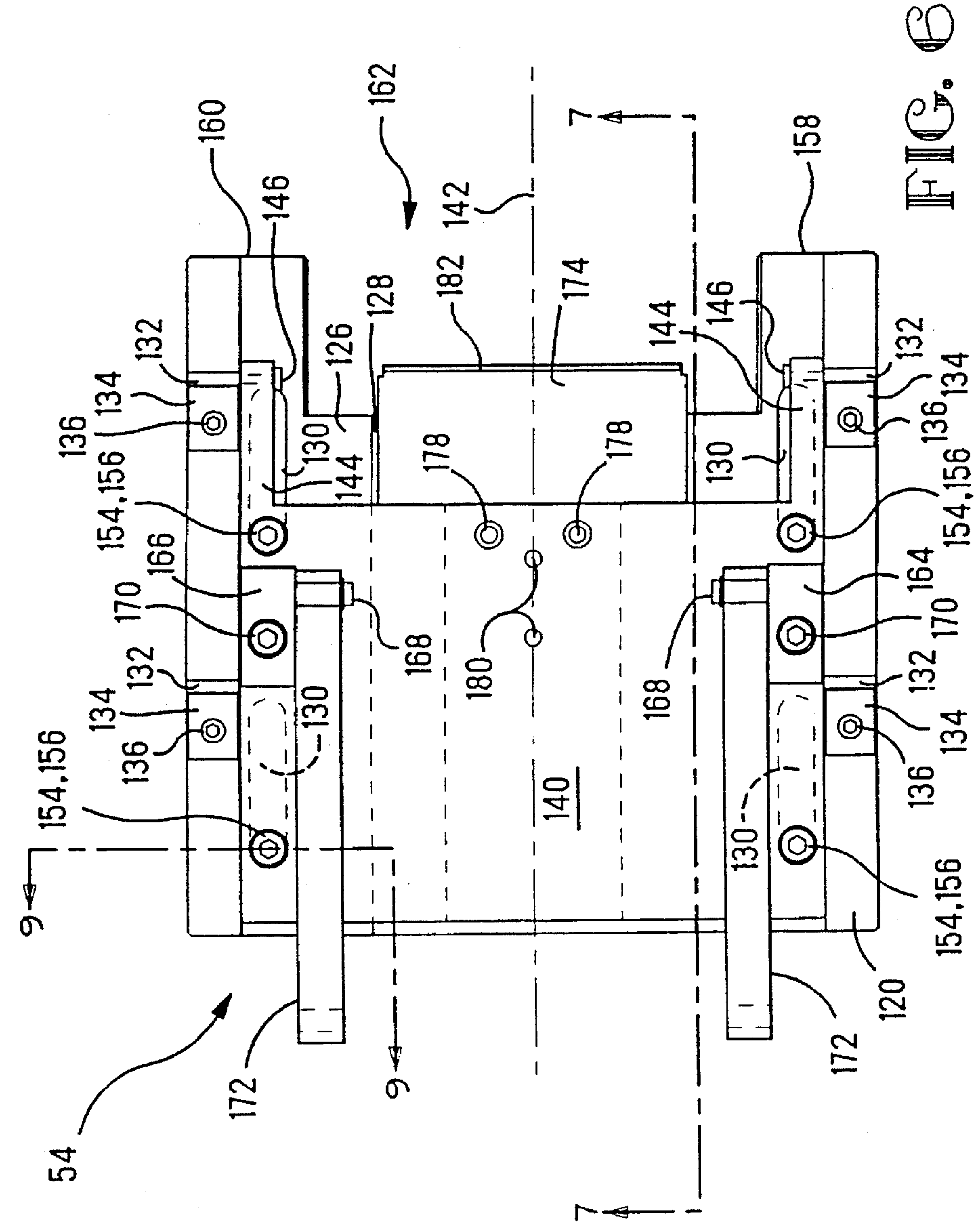
FIG. 6 is a plan view of the carriage assembly of the machine shown in FIG. 2.
Figure 7:
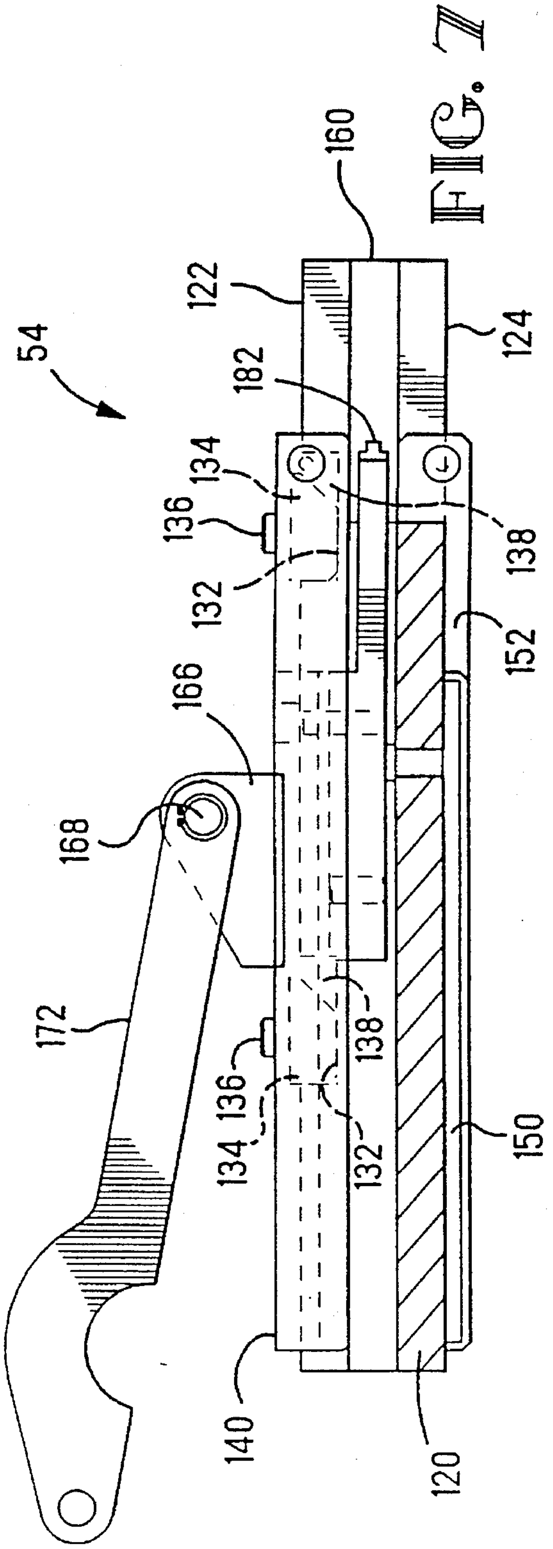
FIG. 7 is a cross-sectional view taken along the lines 7—7 in FIG. 6.
Figure 8:
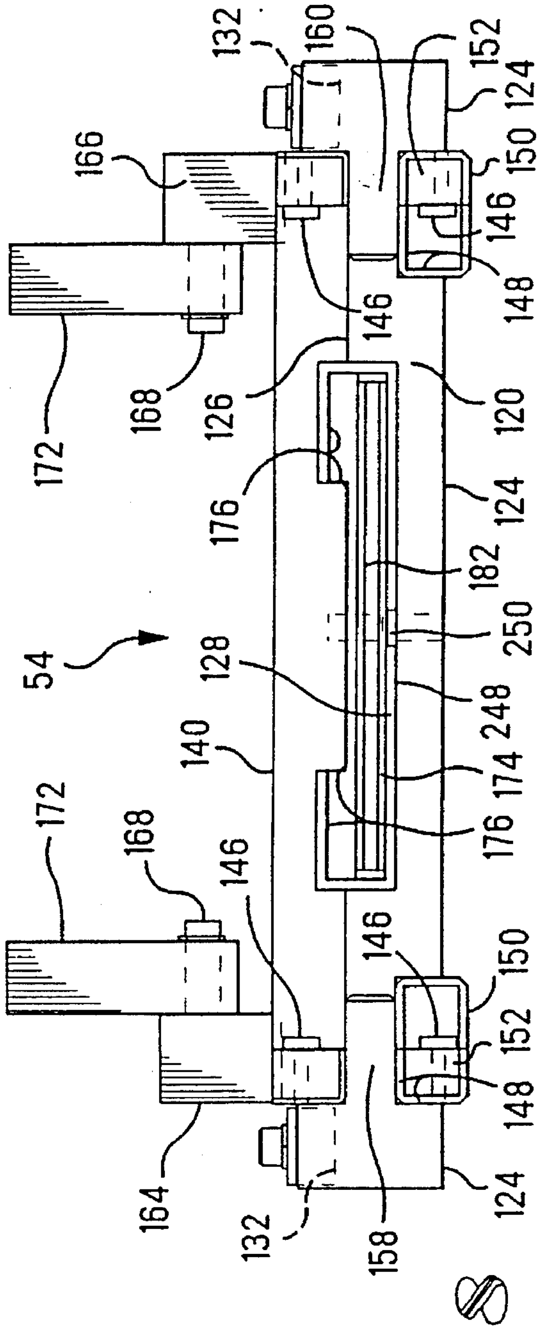
FIG. 8 is an end view of the assembly shown in FIG. 6.
Figure 9:
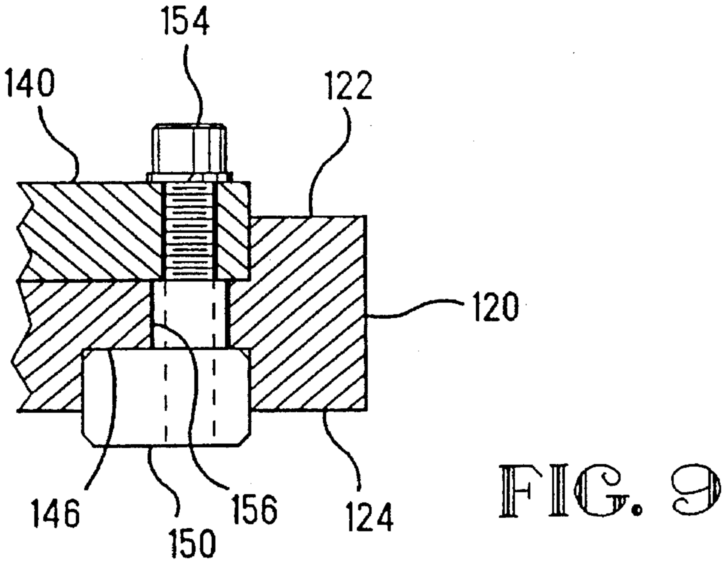
FIG. 9 is a partial cross-sectional view taken along the lines 9—9 in FIG. 6.

A connector pusher plate 174 is located in a pair of slots 176 formed in the under surface of the slide member 140, as best seen in FIGS. 6, 7, and 8. The pusher plate 174 is attached to the slide member 140 by the screws 178 and the dowel pins 180 so that the pusher plate is carried by the slide member. The leading edge 182 of the pusher plate 174 is configured to engage an inside surface of the housing of the connector 10 (FIG. 1) and an edge of the ground bus 30 so that adequate support is provided when the pusher plate pushes the connector into position on the circuit board, as will be further explained below.

Figure 10:
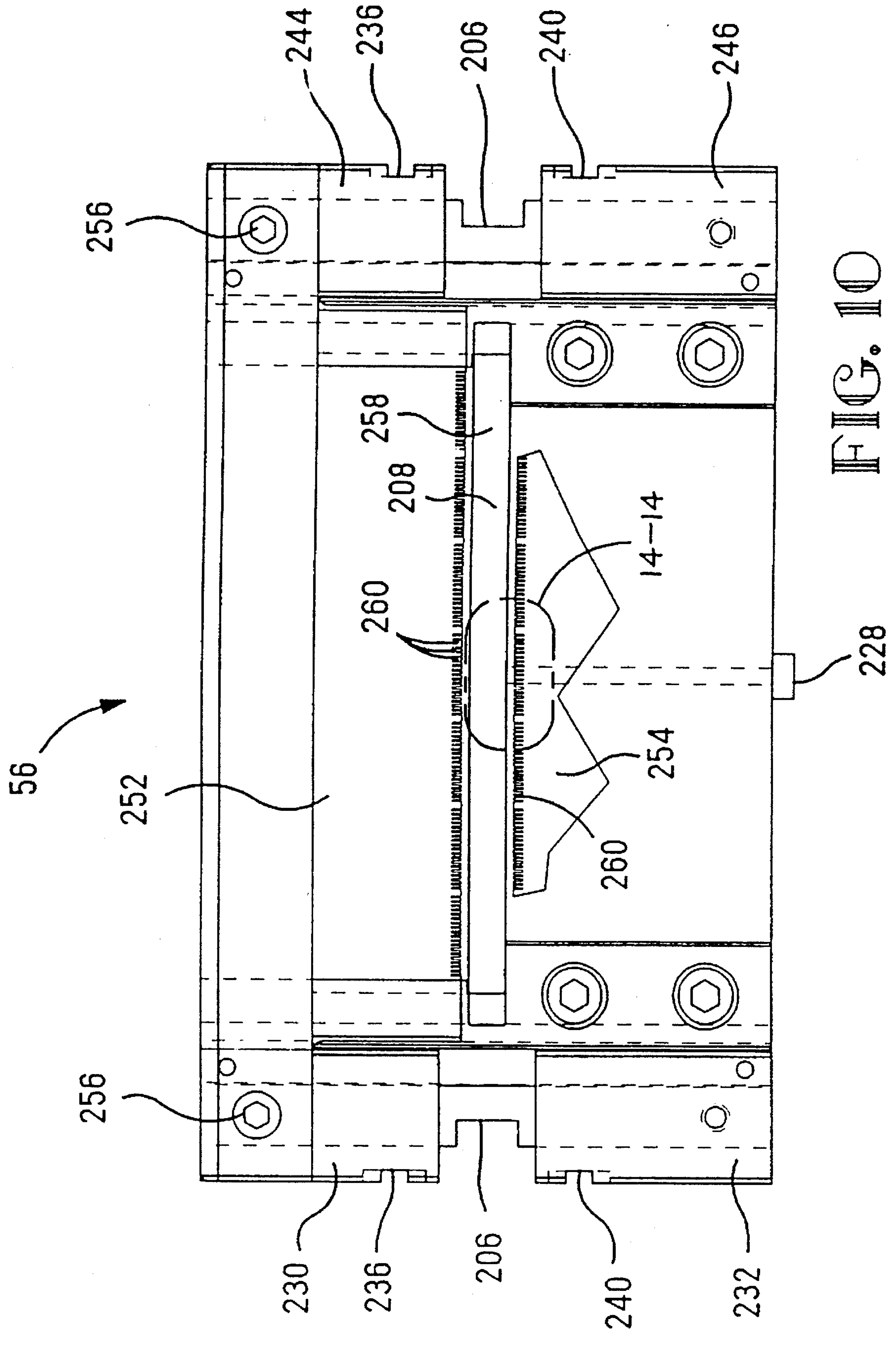
FIG. 10 is a front view of the connector holder assembly of the machine shown in FIG. 2.
Figure 11:
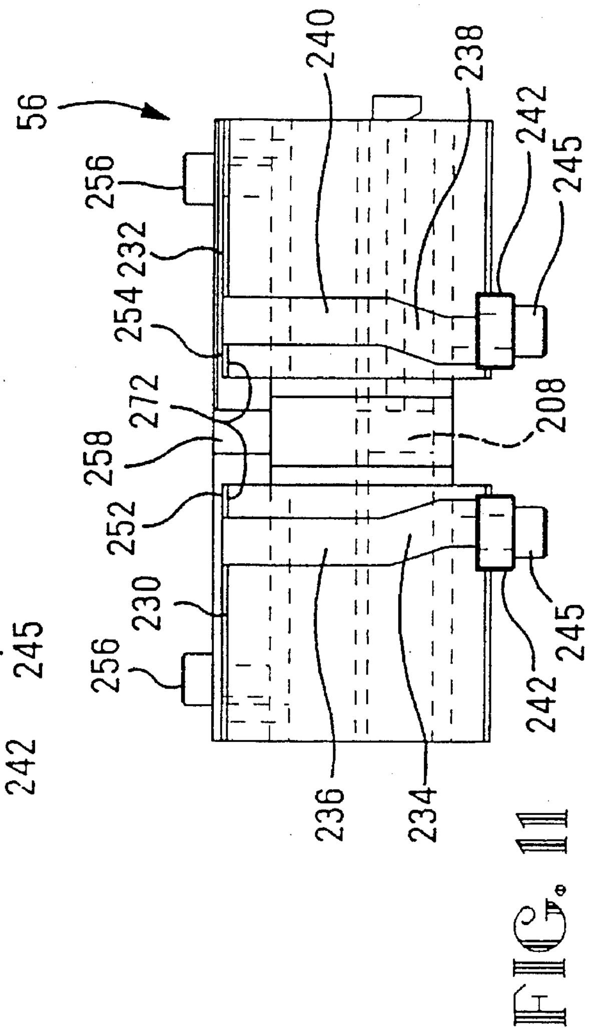
FIGS. 11 and 12 are end and plan views of the assembly shown in FIG. 10.
Figure 12:
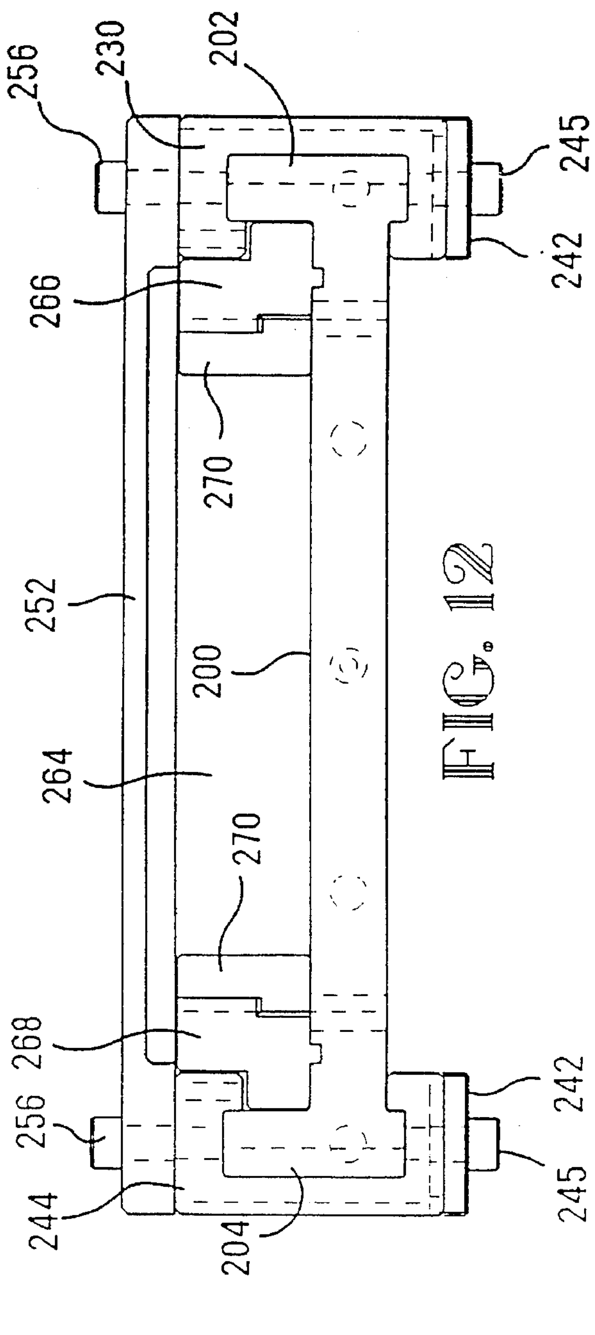

The connector holder assembly 56, as shown in FIGS. 10, 11, and 12, includes a vertical support plate 200 having a left flange 202 and a right flange 204 on opposite ends (FIG. 12). Each flange has a horizontally disposed slot 206 formed therein and sized to be a close slip fit with the left and right portions 158 and 160 respectively, of the carriage plate 120. This allows the plate 200 to freely slide back and forth with respect to the carriage plate 120 in the direction of the centerline 142. An elongated opening 208 is horizontally disposed through the plate 200, in alignment with the pusher plate 174, and sized so that the end 182 of the pusher plate (FIG. 7) can extend therethrough with little clearance along the bottom surface of the opening.

Figure 13:
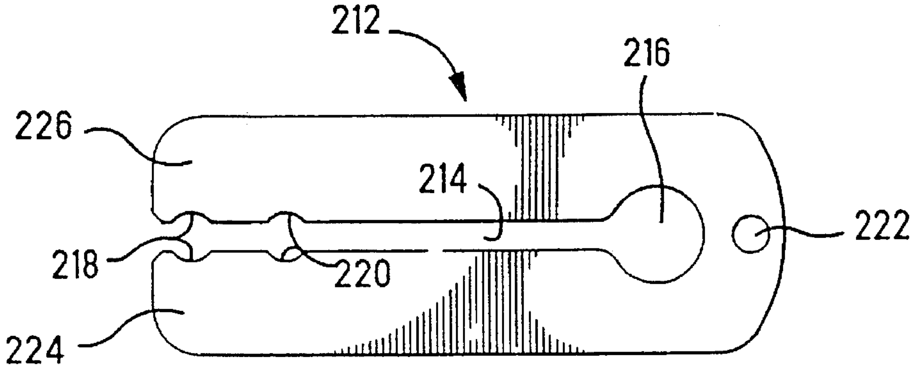
FIG. 13 is a plan view of a detente plate that attaches to the assembly shown in FIG. 10.
Figure 14:
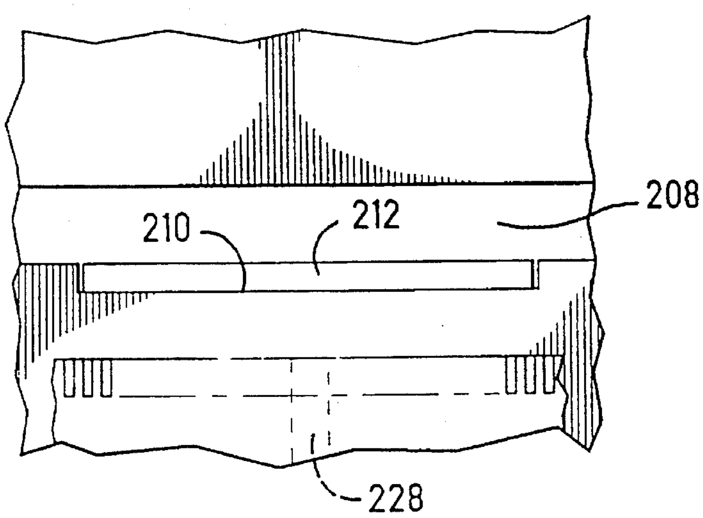
FIG. 14 is an enlarged partial elevation view of the pusher plate-receiving region 14—14 of the connector holder assembly of FIG. 10, showing the detente plate of FIG. 13 in position.

A recess 210 is formed in the lower surface of the opening 208 and sized to loosely receive a detente plate 212, as best seen in FIG. 14, the detente plate being detailed in FIG. 13. The detente plate 212 is a relatively thin rectangular member having a long slot 214 intersecting one end and running most of the length of the member and terminating in a hole 216. First and second detente openings 218 and 220 are formed in the walls of the slot 214 as shown. A retainer pin hole 222 is formed in the end of the plate 212 adjacent the hole 216. The plate 212 is made of a spring material so that the two ends 224 and 226 will elastically spread apart when a pin that is of the size of the opening 218 is forced into the end of the slot 214. When the pin reaches the opening 218 the ends 224 and 226 will return to their rest position, holding the pin captive within the opening. The opening 220, being of the same size as the opening 218, is spaced therefrom by a specific amount and functions in a similar manner. As shown in FIGS. 10 and 14 a retainer pin 228 is disposed in a hole formed in the vertical support plate 200 so that it intersects the center of the recess 210. The retainer pin extends into the hole 222, and since the pusher plate 174 is directly above the lower surface of the opening 208, the detente plate 212 is effectively retained within the recess 210. The purpose of the detente plate 212 will be explained below.

A pair of upper and lower U-shaped members 230 and 232 respectively are arranged to slide freely toward and away from each other along the flange 202. A cam slot 234 that slopes upwardly to a horizontal slot 236 is formed in the side of the U-shaped member 230 as best seen in FIG. 11. A similar cam slot 238 that slopes downwardly to a horizontal slot 240 is formed in the side of U-shaped member 232. These slots are sized to receive the cam follower pins 146 with very little play. A retainer 242 is attached by screw 245 to the edge of each of the U-shaped members adjacent the cam slots to retain the follower pins within the cam slots. Similarly, another pair of upper and lower U-shaped members 244 and 246 respectively, are arranged to slide freely toward and away from each other on the flange 204. U-shaped members 244,246 have cam slots 234,238 and horizontal slots 236,240 respectively, and a retainer 242 and screw 245 adjacent each slot in a manner similar to the U-shaped members 230 and 232. With the connector holding assembly 56 in position within the opening 162 of the carriage plate 120, the cam follower pins 146 are in operational engagement with the cam slots 234 and 238 of each of the U-shaped members 230, 232, 244, and 246. As the slide member 140 is advanced, to the right, as viewed in FIG. 6, the cam followers 146 riding in the cam slots 234 and 238 cause the U-shaped members of each pair to move toward each other until the cam followers reach the horizontal slots 236 and 240 and the U-shaped members are in their closed positions. At this point, as movement of the slide member 140 continues, the U-shaped members remain in their closed positions thereby providing a lost motion effect for a purpose that will be explained.

The connector holding assembly 56 is coupled to the carriage plate 120 by means of the detente plate 212. As is shown in FIG. 8, there is an opening 248 between the floor of the second recess 128 and the bottom of the pusher plate 174. The detente plate 212 is disposed within this opening. A pin 250 having a head is pressed into a hole formed in the bottom of the recess 128 so that the head is within the opening 248. The head is dimensioned to the same size as the openings 218 and 220 of the detente plate 212, and will normally be in one of these openings.

Upper and lower combs 252 and 254 respectively, are attached to the edges of the U-shaped members 230, 232, 244, and 246 by means of the screws 256 as shown in FIGS. 10, 11 and 12. The combs are carried with the U-shaped members as they are moved back and forth between their open and closed positions. In the open comb position, shown in FIGS. 10 and 11, the opening 258 between their opposing edges is wide enough to permit passage of a connector. In the closed comb position, however, the opening 258 will not allow the housing of the connector to pass. A series of slots 260 are formed in the opposing edges of the combs and are spaced to conform with the spacing of the solder tails 38 and 40 of the connector 10 (FIG. 1). The width of the slots 260 provide a small amount of clearance for the solder tails so that they can be positioned in the slots. In the present example, the entire solder tail is not received in the slot 260, but rather a projection 262 formed on the outer edge of the solder tail, as best seen in FIG. 1, is received in the slot. A lead in chamfer is provided for each slot 260 to aid in the insertion. As best seen in FIG. 12, the comb 252 and the face of the vertical support plate 200 form a cavity 264 for receiving a magazine, not shown, that dispenses the connector 10. A pair of alignment blocks 266 and 268 having lower shoulders 270 are rigidly attached to the face of the vertical support plate 200 as shown in FIG. 12. The alignment blocks 266 and 268 are arranged to accurately locate the connector magazine. With the magazine in place the lowest connector in the magazine is positioned on the shoulders 270 thereby providing accurate vertical positioning.

OPERATION OF THE INVENTION

Referring now to FIGS. 2, 4 and 12, a magazine of connectors 10 is loaded into the cavity 264 and the first circuit board 12 is positioned on and secured to a fixture 280, shown in FIGS. 2 and 4. Circuit board 12 is placed on upper surface 282 of fixture 280 to be disposed upon a board-receiving surface portion 284, with locating pins 286 extending upwardly from surface portion 284 received into precisely complementary holes 288 of board 12 for precision board placement during assembly (FIG. 4). Fixture 280 in turn is precisely positioned on the upper surface of ledge 90 with locating posts 290 extending upwardly from ledge 90 received into precisely complementary fixture holes 292 for accurate fixture placement. Fixture 280 is customized to a particular circuit board 12, with surface portion 284 being contoured or profiled to provide clearance for any components which may be mounted to the bottom surface of circuit board 12, all such that the bottom surface of circuit board 12 is disposed at a precise angle with respect to the upper surface of ledge 90 (such as preferably parallel). If desired, the board-receiving surface portion may be defined in a board-receiving nest or pocket. With surface portion 284 being defined on fixture 280 a precisely controlled distance above the bottom surface of the fixture, the bottom surface of circuit board 12 is now precisely referenced to the machine of the present invention for precise determination of the medial plane 44 and precise application of a connector to the circuit board edge.

Referring to FIG. 2 in operation, the head of the pin 250 (FIG. 8) is disposed in the opening 220 of the detente plate 212 (FIG. 13). The handle 108 is then pulled by the operator in the direction indicated by the arrow A. As the shaft 98 begins to rotate the crank arms 100 cause the levers 172 to allow the carriage assembly 54 and the links 72 and 74 to pivot about their respective pivot points thereby causing the connector holder assembly 56 to move downwardly toward the surface 90. This downward movement continues until the sensor pins 86 engage the upper major surface 14 of the circuit board 12. At this point the centerline of the connector 10 that is positioned on the shoulders 270 is coincident with the center plane 44 of the circuit board 12. Further movement of the handle 108 in the direction of the arrow A causes the levers 172 to push the slide member 140 in a direction that is parallel with the plane 44 and generally toward the circuit board 12. At the beginning of this movement of the slide member 140 the follower pins 146 engage the cam slots 234 and 238 in the U-shaped members 230, 234, 244, and 246 causing the U-shaped members to move toward the plane 44 to their closed position where the follower pins are just entering the horizontal slots 236 and 240. The connector holder assembly is prevented from moving by the head of the pin 250 being in the opening 220 of the detente plate 212. As movement of the handle continues, the leading edge 182 of the pusher plate 174 engages surfaces on the inside of the housing and the center ground contacts 30 of the connector 12 thereby pushing the connector 10 toward the circuit board 12.

As the connector moves toward the circuit board the follower pins 146 move in the horizontal slots 236 and 240 maintaining the combs in their closed position and the projections 262 on each of the solder tails 38 and 40 enter respective slots 260 in the combs 252 and 254 until the housing of the connector 10 abuts against the inside face 272 of the combs and begins pushing the combs and the entire connector holding assembly 56 toward the circuit board 12. Since the connector detente plate 212 is pinned to the vertical support plate 200, it moves along with the connector holding assembly 56 causing the ends 224 and 226 to spread apart as the head of the pin 250 slips out of the opening 220. Immediately thereafter the tips of the solder tails engage the edge 18 of the circuit board 12, the lead in portion of the tails in the row 38 camming up to the major surface 14 and the angled free ends of the tails in the row 40 camming down to the major surface 16 while the slots 260 maintain the delicate solder tails in alignment and prevent them from bending or deflecting.

As the connector 10 continues to move toward the circuit board 12, the ground posts 32 enter into the openings 26 in the edge of the circuit board 12 and engage and enter the plated through holes 24, at the same time the solder tails 38 and 40 engage their respective solder pads 22 on the board 12. At this point the handle 108 is fully forward, the head of the pin 250 is in the opening 218 of the detente plate 212, and the connector 10 is assembled to the circuit board 12 and ready for soldering. The frictional engagement of the ground posts 32 in their respective openings 26 and the solder tails 38 and 40 pressing against the solder pads 22 on each side of the circuit board is sufficient to hold the connector in place on the board until soldering. Note that all of the sequential movements of the machine elements described above were accomplished by a single motion of the handle 108 in the direction of the arrow A. The handle 108 is then moved in a direction opposite that of the arrow A which causes the slide member 140 to move to the left, as viewed in FIG. 6, thereby retracting the pusher 174 away from the connector 10, the follower pins 146 then engaging the cam slots 234 and 238 causing the U-shaped members 230, 234, 244, and 246 to move apart thereby moving the combs 252 and 254 apart to their open position as shown in FIG. 10. While this is occurring the connector holder assembly is held stationary with respect to the carriage plate 120 by the head of the pin 250 being in the opening 218. When the follower pins engage the retainers 242, the entire connector holder assembly 56 is now pulled along with the slide member 140 until it is clear of the connector 10 and board 12. This causes the detente plate 212 to move with respect to the pin 250 so that the head of the pin is forced out of the opening 218 and into the opening 220 again. The connector and board assembly is then removed and a new circuit board 12 is secured in place in the fixture 272 and the process repeated.

An important advantage of the present invention is that a single operator effected motion of the handle caused the several functional motions of the elements of the machine. Another important advantage is that the actual thickness of the circuit board is sensed and the center of the connector is automatically adjusted to correspond with the center of the board, thereby tolerating a wide variation from the nominal dimension of the thickness of the circuit board.

We claim:

1. A method for assembling an electrical connector to an edge of a circuit board by attaching leads of said connector to circuitry on at least one of first and second opposed major surfaces of said circuit board utilizing a machine for positioning said electrical connector with respect to said edge of a said circuit board, said circuit board having a thickness between said opposed major surfaces and defining a plane that intersects the center of an edge surface of said edge and is substantially parallel with said major surfaces, said machine including: a frame; means attached to said frame for receiving said circuit board and positioning said second major surface with respect to said frame; sensing means for sensing the thickness of said circuit board; alignment means coupled to said frame and responsive to said sensing means for positioning said connector in a first position in alignment with said plane; and advancing means for moving said connector from said first position along said plane and in alignment therewith to a second position wherein said leads of said connector are in engagement with said circuitry on said circuit board, the method comprising the steps:

(a) securing said circuit board in said means for receiving said board;

(b) placing said connector in a connector holding module of said machine;

(c) sensing said thickness of said circuit board and aligning said connector in said first position with a centerline of said connector substantially coincident with said plane; and (d) moving said connector from said first position along said plane and in alignment therewith to said second position in assembled engagement with said edge of said circuit board.

2. The method according to claim 1 wherein said sensing means includes a member attached to said module that is arranged to limit said movement of said module by engaging said major surface of said circuit board, so that when said module is moved toward said first surface said movement will continue only until said member engages said major surface, and wherein said sensing of step (b) includes moving said member into said engagement with said major surface of said circuit board.

3. The method according to claim 2 wherein said module includes an upper comb and a lower comb, each comb having opposing edges with openings therein for receiving portions of said leads and for supporting said leads while said connector is in said first position and during said moving of said connector from said first position to said second position, wherein said moving of step (d) includes moving said connector so that said portions of said leads are received in said openings of said combs prior to moving said connector into said assembled engagement.

4. The method according to claim 3 wherein said machine includes an actuating lever arranged for motion in only a first direction and in an opposite direction, wherein movement of said lever in said first direction effects said moving in steps (c) and (d).

* * * * *